US012651800B2

(12) United States Patent　　　　　(10) Patent No.:　US 12,651,800 B2
Guo et al.　　　　　　　　　　　　　　(45) Date of Patent:　　Jun. 9, 2026

(54) BATTERY APPARATUS

(71) Applicant: CALB Co., Ltd., Jiangsu (CN)

(72) Inventors: Liqing Guo, Changzhou (CN);
Fanming Kong, Changzhou (CN)

(73) Assignee: CALB Co., Ltd., Jiangsu (CN)

( * ) Notice: Subject to any disclaimer, the term of this patent is extended or adjusted under 35 U.S.C. 154(b) by 605 days.

(21) Appl. No.: 17/689,874

(22) Filed: Mar. 8, 2022

(65) Prior Publication Data

US 2023/0216132 A1　　Jul. 6, 2023

(30) Foreign Application Priority Data

Dec. 31, 2021　(CN) ......................... 202111672416.4

(51) Int. Cl.
| | |
|---|---|
| *H01M 50/296* | (2021.01) |
| *H01M 50/224* | (2021.01) |
| *H01M 50/24* | (2021.01) |
| *H01R 11/28* | (2006.01) |
| *H01R 13/512* | (2006.01) |
| *H01R 13/62* | (2006.01) |
| *H01R 13/658* | (2011.01) |
| *H05K 9/00* | (2006.01) |

(52) U.S. Cl.
CPC ....... *H01M 50/296* (2021.01); *H01M 50/224* (2021.01); *H01M 50/24* (2021.01); *H01R 11/281* (2013.01); *H01R 13/512* (2013.01); *H01R 13/62* (2013.01); *H01R 13/658* (2013.01); *H05K 9/0007* (2013.01)

(58) Field of Classification Search
CPC . H01M 50/296; H01M 50/244; H01R 11/281; H01R 11/289
See application file for complete search history.

(56) References Cited

U.S. PATENT DOCUMENTS

| | | | |
|---|---|---|---|
| 10,923,727 B2 | 2/2021 | Fan et al. | |
| 2008/0220652 A1 | 9/2008 | Tyler | |
| 2009/0053588 A1* | 2/2009 | Marukawa | H01M 50/276 429/97 |
| 2011/0081572 A1* | 4/2011 | Byun | H01M 50/562 429/163 |

(Continued)

FOREIGN PATENT DOCUMENTS

| | | |
|---|---|---|
| CN | 101373820 | 2/2009 |
| CN | 103124013 | 5/2013 |

(Continued)

OTHER PUBLICATIONS

DE102014216281A1 translation (Year: 2016).*

(Continued)

*Primary Examiner* — Allison Bourke
*Assistant Examiner* — Travis L. Martin
(74) *Attorney, Agent, or Firm* — JCIP GLOBAL INC.

(57)　　　　　　ABSTRACT

A battery apparatus includes a casing and at least one first insert disposed on the casing. The first inserts has an electromagnetic shielding layer. The battery apparatus further includes at least one second insert disposed on the casing. The first insert and the second insert are arranged at intervals. The electromagnetic shielding layer of the first insert is electrically connected to the casing through the second insert.

10 Claims, 5 Drawing Sheets

(56) References Cited

U.S. PATENT DOCUMENTS

| | | | | |
|---|---|---|---|---|
| 2013/0090009 A1* | 4/2013 | Zhao | .................. | H01R 13/6456 |
| | | | | 439/607.01 |
| 2021/0288376 A1* | 9/2021 | Jeon | .................... | H01M 50/207 |
| 2022/0102879 A1* | 3/2022 | Kim | .................... | H01R 11/289 |

FOREIGN PATENT DOCUMENTS

| | | | | |
|---|---|---|---|---|
| CN | 206602142 | 10/2017 | | |
| CN | 109478615 | 3/2019 | | |
| CN | 211789840 | 10/2020 | | |
| CN | 216529174 | 5/2022 | | |
| DE | 102014216281 | 2/2016 | | |
| DE | 102014216281 A1 * | 2/2016 | ......... | H01R 13/6597 |
| DE | 202019100047 | 1/2019 | | |
| JP | 2013109919 | 6/2013 | | |
| WO | 2013073229 | 5/2013 | | |

OTHER PUBLICATIONS

"Search Report of Europe Counterpart Application", issued on Feb. 21, 2023, p. 1-p. 7.

"Office Action of China Counterpart Application", issued on Dec. 22, 2025, p. 1-p. 9.

"Examination report of India Counterpart Application", issued on Oct. 17, 2025, p. 1-p. 6.

"Office Action of China Counterpart Application", issued on Jun. 6, 2025, p. 1-p. 11.

* cited by examiner

BATTERY APPARATUS

CROSS-REFERENCE TO RELATED APPLICATION

This application claims the priority benefit of China application no. 202111672416.4, filed on Dec. 31, 2021. The entirety of the above-mentioned patent application is hereby incorporated by reference herein and made a part of this specification.

BACKGROUND

Technical Field

The disclosure relates to the technical field of batteries, and in particular, to a battery apparatus.

Description of Related Art

A battery pack may include a casing as well as a high-voltage insert disposed on the casing, and an electromagnetic shielding layer is disposed on a surface of the high-voltage insert.

When the electromagnetic shielding layer is electrically connected to the casing, the electromagnetic shielding layer may shield the electromagnetic interference of the high-voltage insert to other devices.

As such, how to implement the electrical connection between the electromagnetic shielding layer and the casing is a technical problem that needs to be urgently solved by a person having ordinary skill in the art.

SUMMARY

The disclosure provides a battery apparatus.

The battery apparatus includes a casing and at least one first insert disposed on the casing. The first insert has an electromagnetic shielding layer. The battery apparatus further includes at least one second insert disposed on the casing, and the first insert and the second insert are arranged at intervals. The electromagnetic shielding layer is electrically connected to the casing through the second insert.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

In particular, a reference to "the" object or "a" and "an" object is intended to denote also one of a possible plurality of such objects. Unless otherwise defined or described, the terms "connect", "fix" should be broadly interpreted, for example, the term "connect" can be "fixedly connect", "detachably connect", "integrally connect", "electrically connect" or "signal connect". The term "connect" also can be "directly connect" or "indirectly connect via a medium". For the persons skilled in the art, the specific meanings of the abovementioned terms in the present disclosure can be understood according to the specific situation.

Further, in the description of the present disclosure, it should be understood that spatially relative terms, such as "above", "below" "inside", "outside" and the like, are described based on orientations illustrated in the figures, but are not intended to limit the exemplary embodiments of the present disclosure.

In the context, it should also be understood that when an element or features is provided "outside" or "inside" of another element(s), it can be directly provided "outside" or "inside" of the other element, or be indirectly provided "outside" or "inside" of the another element(s) by an intermediate element.

Figure 1:
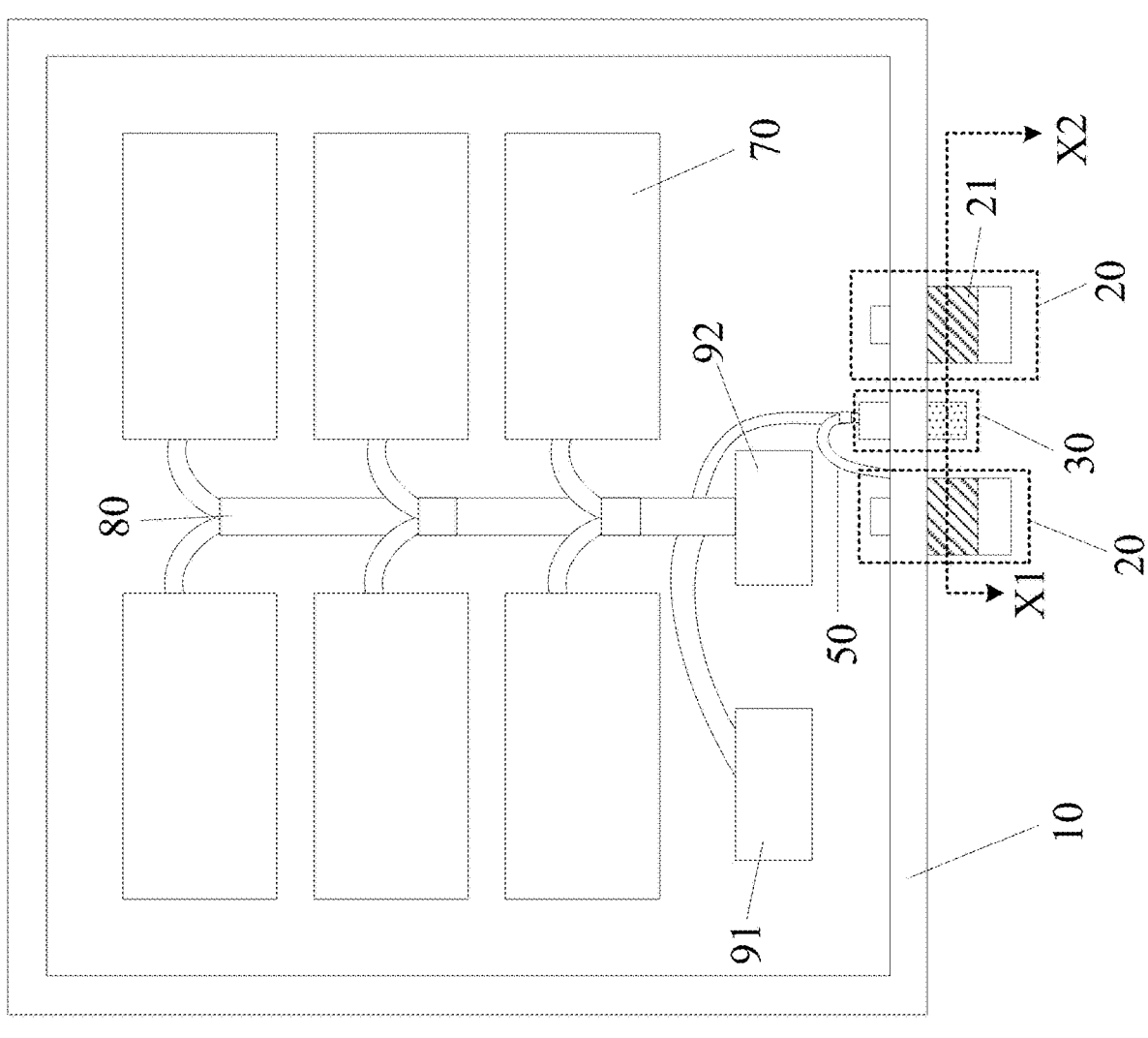
FIG. 1 is a schematic view of a structure of a battery apparatus according to an embodiment of the disclosure.

The embodiments of the disclosure provide a battery apparatus, as shown in FIG. 1, and the battery apparatus includes a casing 10 and first inserts 20 disposed on the casing 10. The first inserts 20 are respectively provided with electromagnetic shielding layers 21. The battery apparatus further includes a second insert 30 disposed on the casing 10. The first inserts 20 and the second insert 30 are arranged at intervals. Herein, the electromagnetic shielding layers 21 are electrically connected to the casing 10 through the second insert 30.

In this way, since the second insert is electrically connected to both the electromagnetic shielding layers and the casing, the electromagnetic shielding layers of the first inserts are electrically connected to the casing, and effectiveness and reliability of electrical connection are improved.

Further, through such arrangement, a surface of the casing is not required to be coated with an anti-corrosion conductive layer, but an effective electrical connection between the electromagnetic shielding layers and the casing may still be achieved, and adverse effects of corrosion on the electrical connection may be avoided. Therefore, the safety and reliability of the battery apparatus are improved while a manufacturing process is simplified and manufacturing costs are lowered.

Optionally, in the embodiments of the disclosure, the electromagnetic shielding layers 21 may be disposed on surfaces of the first inserts 20, as shown in FIG. 1, but it is not limited thereto. As long as the electromagnetic shielding layers are arranged to be disposed on the first inserts, such arrangement belongs to the protection scope of the embodiments of the disclosure, and the specific arrangement position of the electromagnetic shielding layers is not particularly limited herein.

Optionally, in the embodiments of the disclosure, the first inserts may be configured to transmit the electrical signals, and the electrical signals may be voltage signals or current signals. Further, the number of the first inserts may be set to one (not shown), and certainly, this number may be two (as shown in FIG. 1), three (not shown), or other numbers. The number of the first inserts may be set according to the functions of the first inserts and other factors, and it is not particularly limited herein.

Optionally, in the embodiments of the disclosure, the first inserts are high-voltage inserts, and the second insert is a high-voltage interlocking insert. Herein, the high-voltage inserts may be configured to transmit high-voltage signals, and the high-voltage inserts may include, but not limited to, an insert of an input terminal configured for transmitting anode and cathode signals and an insert of an output terminal configured for transmitting anode and cathode signals. Through the arrangement of the electromagnetic shielding layers, electromagnetic interference caused by the high-voltage inserts to other devices in the battery apparatus may be avoided, and the reliability and safety of the battery apparatus may be improved.

The high-voltage interlocking insert may be configured to detect whether male and female ends of a high-voltage insert are effectively inserted and thereby to disconnect a high-voltage circuit when the male and female ends are not effectively inserted. In this way, abnormality of the battery apparatus is avoided, and the safety of the battery apparatus is improved. As such, by using the high-voltage interlocking insert to achieve the electrical connection between the electromagnetic shielding layers and the casing, additional structures are not required to be added, and only the existing structures are required to be used. Therefore, the structure of the original battery apparatus is kept, and the structure is simple, may be easily manufactured, and requires low manufacturing costs.

Figure 4:
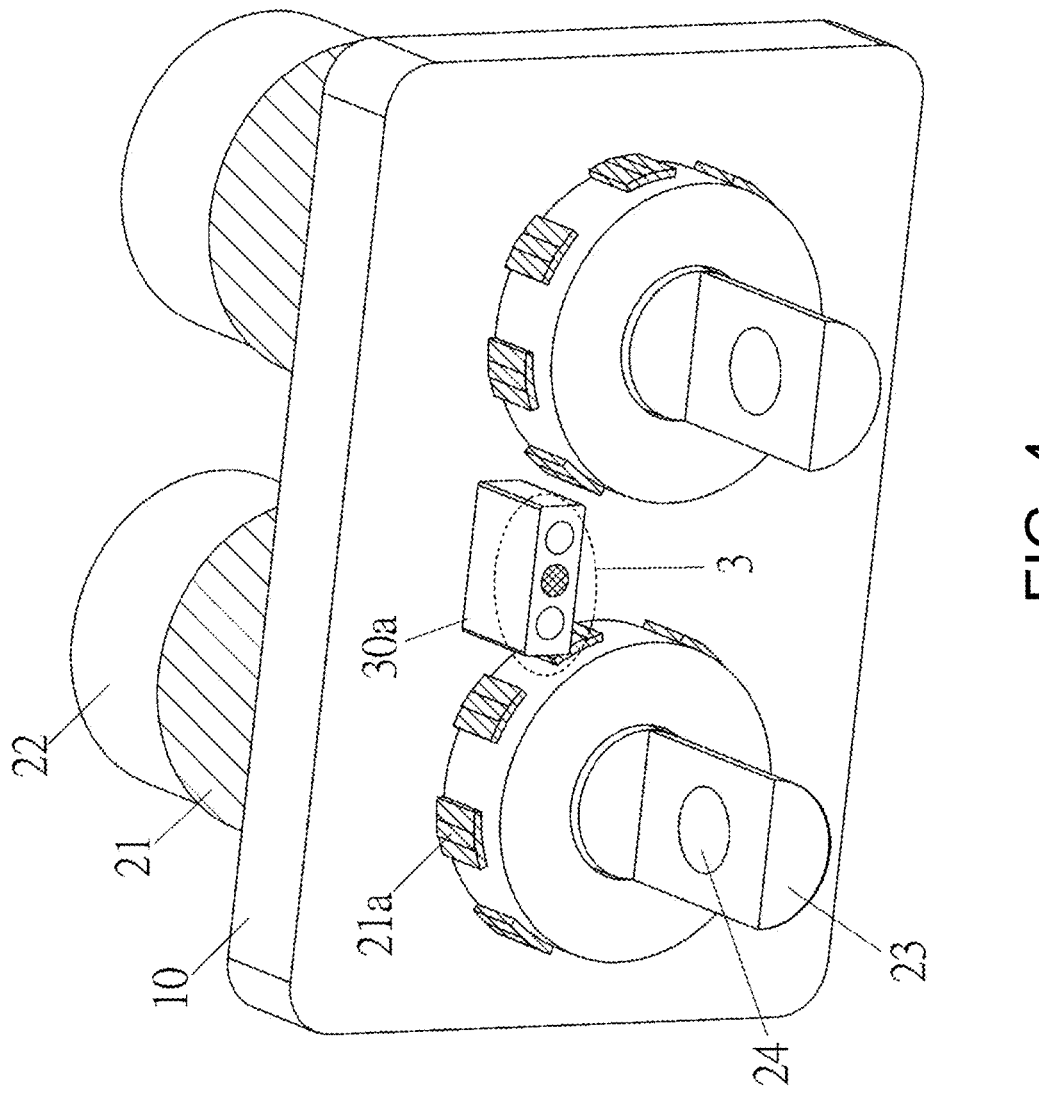
FIG. 4 is a schematic three-dimensional view of a structure of another part of the second insert according to an embodiment of the disclosure.
Figure 5:
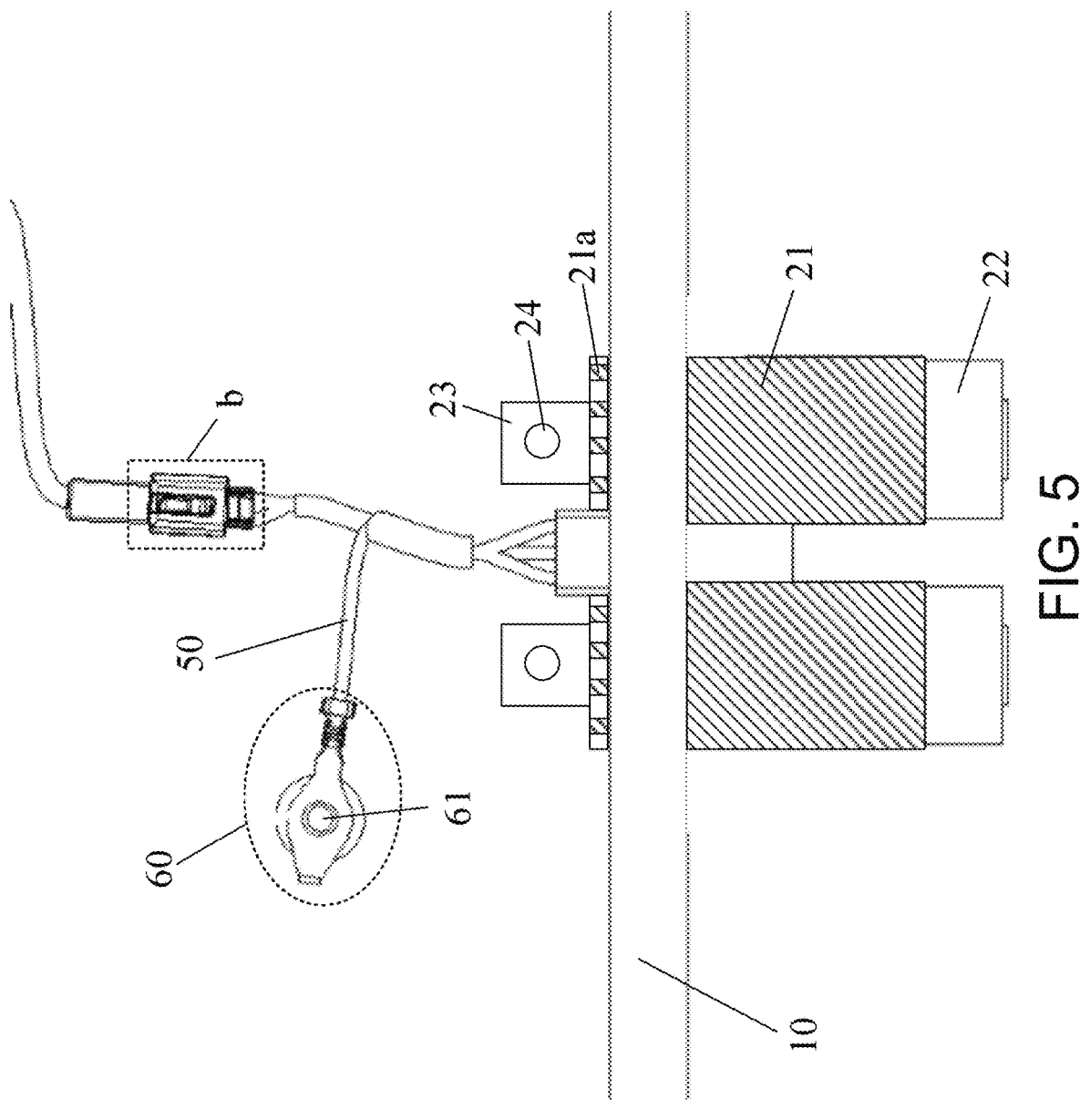
FIG. 5 is a schematic view of a state when the second insert is not electrically connected to a casing according to an embodiment of the disclosure.

To be specific, in the embodiments of the disclosure, in the case that the first inserts 20 are high-voltage inserts, as shown in FIG. 4 and FIG. 5, each of the first inserts 20 includes a body 22 and a connection portion 23 connected to the body 22. The body 22 has a cylindrical shape, and the connection portion 23 has a non-cylindrical shape. An outer surface of the body 22 is provided with the electromagnetic shielding layer 21. Herein, the casing 10 has through holes. The body 22 of each of the first inserts 20 may be inserted into the through hole, and elastic pieces 21*a* connected to the electromagnetic shielding layer 21 may pass through the through hole. Further, the elastic pieces 21*a* may directly contact with the casing 10 in the through hole, and at the same time achieve interference fitting. A connection hole 24 is provided in the connection portion 23 of each of the first inserts 20, and the connection hole 24 may be electrically connected with other structures.

To be specific, the number of the elastic pieces 21*a* may be set according to actual needs, and this number may not be limited to what is shown in FIG. 4 and FIG. 5 and may not be particularly limited herein.

It is noted that, optionally, the structure of each of the high-voltage inserts is not limited to what is shown in FIG. 4 and FIG. 5, and the structure may also be other structures capable of implementing the functions of the high-voltage inserts and is not particularly limited herein.

Certainly, optionally, each of the first inserts may also be a low-voltage insert provided with an electromagnetic shielding layer, and the second insert may be other inserts different from the high-voltage interlocking insert. As long as the electrical connection between the electromagnetic shielding layers and the casing may be achieved through the second insert, it belongs to the protection scope of the embodiments of the disclosure.

Figure 2:
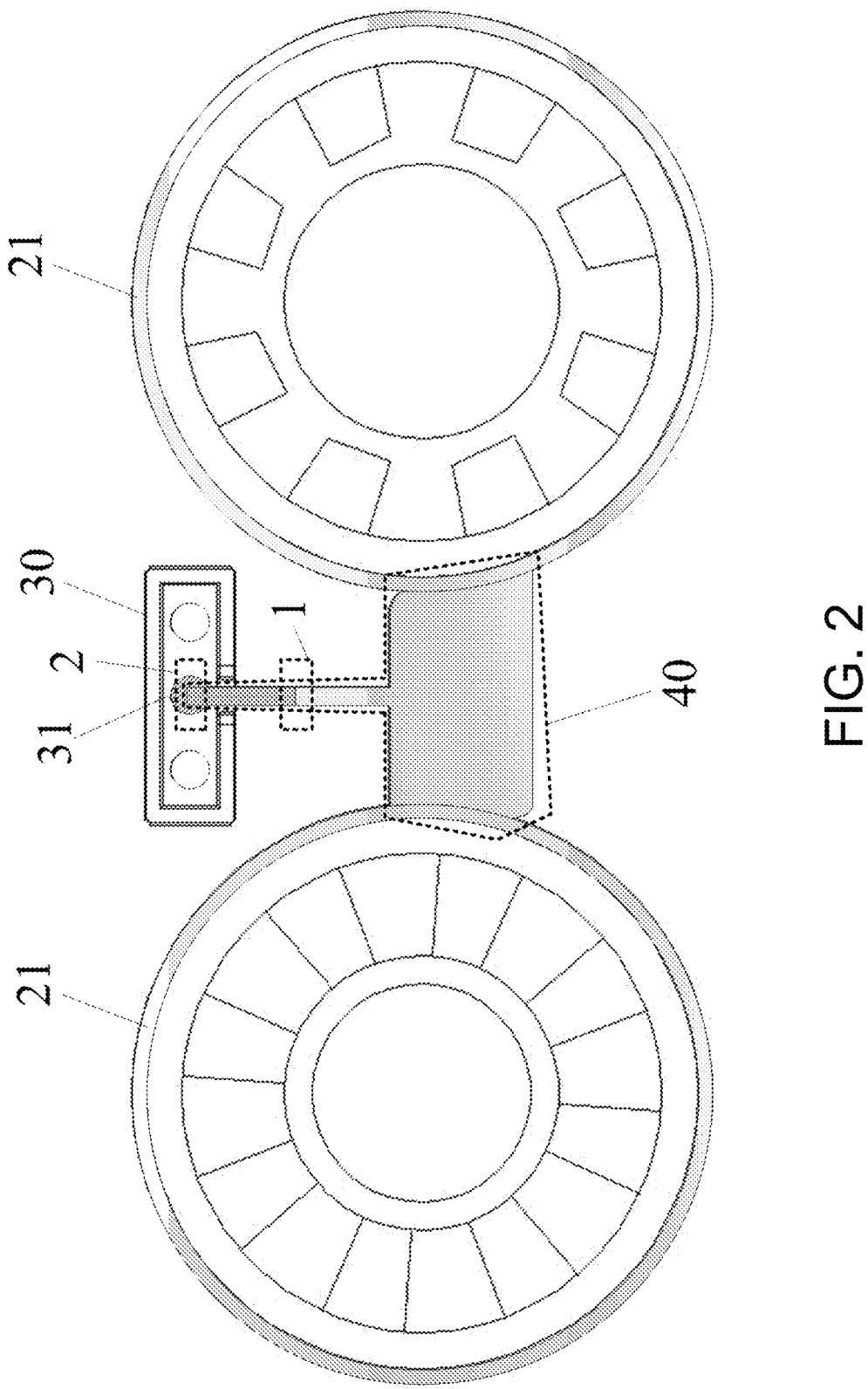
FIG. 2 is a sectional view taken in an X1-X2 direction shown in FIG. 1.
Figure 3:
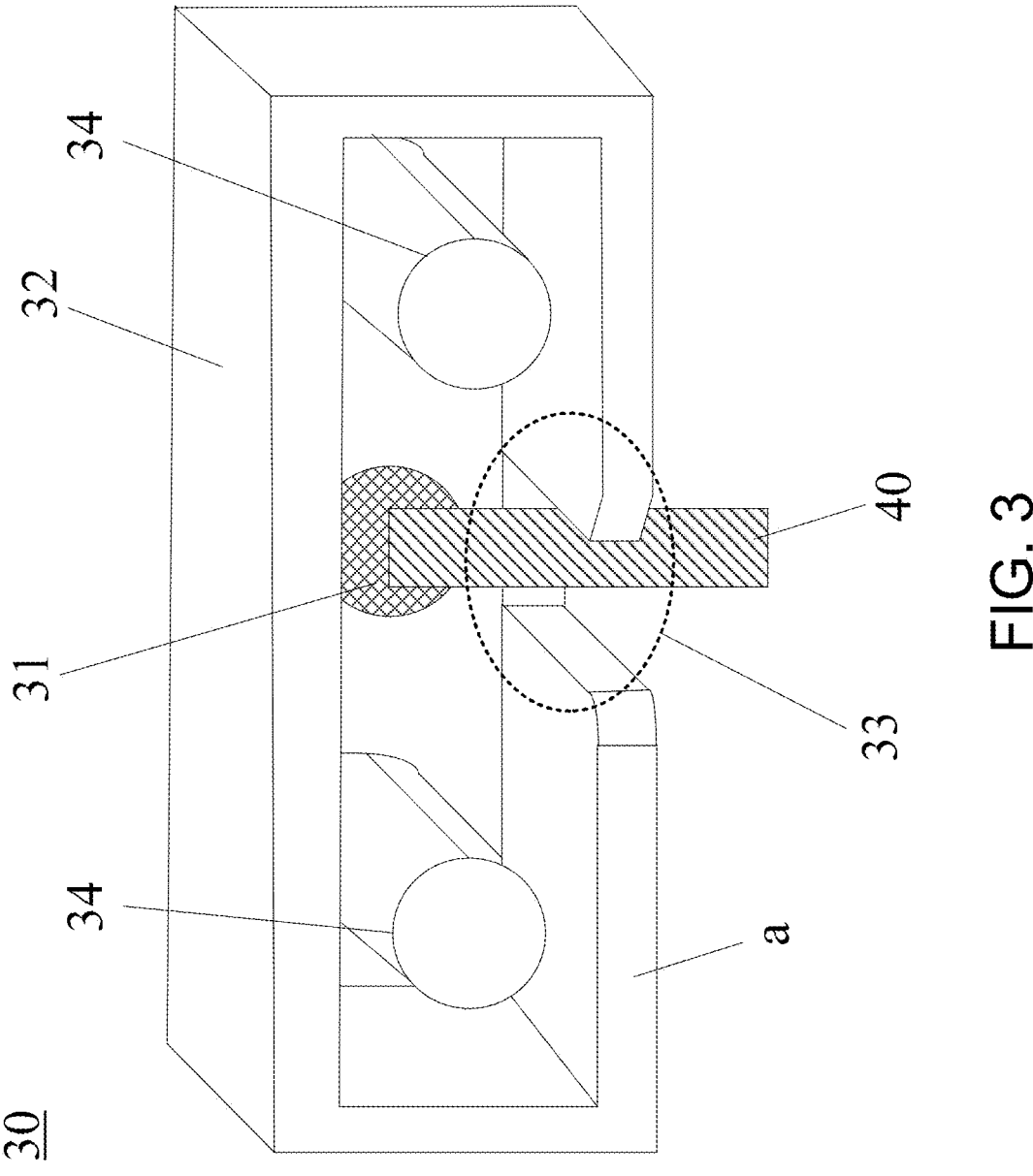
FIG. 3 is a schematic three-dimensional view of a structure of a part of a second insert according to an embodiment of the disclosure.

Optionally, in the embodiments of the disclosure, as shown in FIG. 2, the second insert 30 may be provided with a conductive terminal (with reference to the structure represented by 31 in FIG. 3 as well). The electromagnetic shielding layers 21 are electrically connected to the conductive terminal 31 through a conductive member 40. In this way, the electrical connection between the electromagnetic shielding layers and the conductive terminal is achieved through the conductive member, and that the electrical connection between the electromagnetic shielding layers and the second insert is achieved, and the electrical connection between the electromagnetic shielding layers and the casing is therefore achieved.

To be specific, the conductive member 40 may be, but not limited to, a first wire and/or a metal piece.

Certainly, regarding the specific implementation of the conductive member, in addition to being a first wire or a metal piece, the conductive member may be implemented in other forms, as long as the electrical connection between the electromagnetic shielding layers and the conductive terminal may be achieved through the conductive member, it belongs to the protection scope of the embodiments of the disclosure.

To be specific, in the embodiments of the disclosure, electrical connection between the conductive member and the conductive terminal may be implemented as follows.

The conductive member may be welded to the conductive terminal by welding (the position for welding may be located in the region shown by the dotted frame 2 in FIG. 2).

Alternatively, the conductive terminal and an end portion of the conductive member may be specifically configured, and the conductive member may be inserted onto the conductive terminal by inserting (the position for inserting may also be located in the region shown by the dotted frame 2 in FIG. 2).

Alternatively, a lead-out terminal may be provided on the conductive terminal, the lead-out terminal may be but not limited to a lead-out wire, and the lead-out wire is then connected to the conductive member through welding, crimping, or inserting (the position for welding, crimping, or inserting herein may be located in the region shown by the dotted frame 1 in FIG. 2, and the dotted frame 40 in FIG. 2 herein may represent the combination of the conductive member and the lead-out terminal), so that the electrical connection between the lead-out wire and the conductive member is implemented.

Certainly, in actual applications, in order to allow the electrical connection between the conductive member and the conductive terminal to be implemented, a specific electrical connection manner may be selected according to actual needs, and such selection is not particularly limited herein.

Optionally, in the embodiments of the disclosure, the electromagnetic shielding layers and the conductive member are integrally formed as one piece. That is, the conductive member is manufactured together with the electromagnetic shielding layers. In this way, it may be ensured that the conductive member is well connected to the electromagnetic shielding layers electrically, and the need for a subsequent connection process caused by the non-integrated structure of the conductive member and the electromagnetic shielding layers is decreased. Manufacturing efficiency of the battery apparatus may therefore be improved, and the reliability of the battery apparatus may also be improved.

It is noted that, during the use of the battery apparatus, in order to achieve the electromagnetic shielding effect, a material for making the electromagnetic shielding layers is usually metal, such as but not limited to copper and the like. With the increase in the time of use of the battery apparatus, the metal may be oxidized, resulting in a certain oxidation and corrosion on surfaces of the electromagnetic shielding layers, indicating that the speed of this oxidation and corrosion is relatively slow.

When the electromagnetic shielding layers and the conductive member are integrally formed as one piece, even if the surfaces of the electromagnetic shielding layers are oxidized and corroded, the effective electrical connection between the electromagnetic shielding layers and the conductive member is still ensured, and the oxidation and corrosion may not generate a significant adverse effect on the electrical connection. Therefore, the effective electrical connection between the electromagnetic shielding layers and the casing may still be ensured, the function of the electromagnetic shielding layers is implemented, and the safety and reliability of the battery apparatus are improved.

Certainly, the electromagnetic shielding layers and the conductive member may also be non-integrated structures, that is, the two are independently manufactured and then are assembled to implement the electrical connection between the electromagnetic shielding layers and the conductive member. Through this arrangement, the flexibility of design may be improved. Manufacturing may be performed flexibly based on the internal structural layout and remaining space of the battery apparatus, and in this way, the increase in manufacturing difficulty due to the special shape of the electromagnetic shielding layers may be avoided, and the needs of different application scenarios may also be satisfied.

Optionally, in the embodiments of the disclosure, as shown in FIG. 3, the second insert 30 includes a protective cover 32. The conductive terminal 31 is located in the protective cover 32, and the protective cover 32 has a notch 33. The conductive member 40 (only a partial structure of the conductive member 40 is shown in FIG. 3) is electrically connected to the conductive terminal 31 through the notch 33.

To be specific, the protective cover may be a cavity with an opening, a bottom portion of the protective cover may be fixed onto the casing, and a bottom surface of the protective cover may be parallel to the surface of the casing. Alternatively, the protective cover may be a frame body, the frame body is fixed onto the casing, and sides of the frame body are perpendicular to the surface of the casing. As shown in FIG. 1, the square filled with sparse black dots in the dotted frame (surrounding the second insert 30) in FIG. 1 may represent the frame body.

Further, the protective cover 32 has sides perpendicular to the surface of the casing 10, and herein, the notch 33 may be arranged on a side (the side indicated by a in FIG. 3), so that the conductive member 40 may pass through the notch 33 and enter into the protective cover 32. The conductive member 40 is thereby prevented from entering into the protective cover 32 in a direction perpendicular to the surface of the casing 10, and therefore, when the conductive member 40 is electrically connected to the conductive terminal 31, the conductive member 40 is prevented from being bent and is thus prevented from affecting the electrical connection. Further, the operational difficulty during electrical connection may also be reduced, and separation of the conductive member from the conductive terminal after the battery apparatus is used for a long time may also be prevented from occurring. Moreover, through such arrangement, the rational use of space may be achieved, and the arrangement of other surrounding structures may also be prevented from being affected.

To be specific, in the embodiments of the disclosure, the specific implementation form of the notch is not limited to that shown in FIG. 3, and may also be other forms, such as but not limited to a through hole (not shown) provided on the side (e.g., as shown in FIG. 3) of the protective cover. The conductive member herein may enter into the inside of the protective cover through the through hole. The implementation form of the notch may be configured according to actual needs, which is not particularly limited herein.

Optionally, in the embodiments of the disclosure, as shown in FIG. 1, the second insert 30 is electrically connected to the casing 10 through a conductive member 50, wherein the conductive member 50 is a second wire 50.

It is noted that, the second wire 50 may be located in the casing 10, as shown in FIG. 1. That is, the second insert 30 may have two end portions, one end portion (the white-filled square in the dotted frame (surrounding the second insert 30) in FIG. 1, denoted as an end portion 1, and the second insert 30 shown in FIG. 3 may be understood as the end portion 1) may be located in the casing 10, and the other end portion (the square filled with sparse black dots in the dotted frame (surrounding the second insert 30) in FIG. 1, denoted as an end portion 2) may be located outside the casing 10. The conductive terminal 31 (not shown in FIG. 1) may be located at the end portion 2 and may be disposed outside the casing 10.

Alternatively, the second wire may also be located outside the casing, which is not shown. That is, when the conductive terminal is also located outside the casing, the second wire and the conductive terminal are both located on a same side surface of the casing.

In specific implementation, the position of the second wire may be set according to actual needs, as long as the electrical connection between the second insert and the casing may be achieved through the second wire, which is not particularly limited herein.

Optionally, in the embodiments of the disclosure, the second wire is engaged with or screwed to the casing.

With reference to FIG. 4 together, a partial structure (i.e., the abovementioned end portion 1, which is denoted by 30a in FIG. 4) of the second insert located inside the casing 10 is shown in the figure. Three ports are shown in the figure (as shown in the dotted circle labeled 3), the middle port is a port on the opposite side of the conductive terminal that is electrically connected to the electromagnetic shielding layers 21, and the other two ports are ports used for electrical connection with a battery management system.

Herein, one end of the second wire 50 may be electrically connected to the middle port, and the other end of the second wire 50 may be provided with a connection terminal 60. The effect after connection is shown in FIG. 5, the connection terminal 60 may be engaged with the casing 10 and may also be screwed to the casing 10. Specifically, when the connection terminal 60 is engaged with the casing 10, a buckle (not shown in FIG. 5) may be provided on the casing 10 to facilitate connection and fixation to the connection terminal 60. Alternatively, a groove (not shown in FIG. 5) is provided on the casing 10, so that the connection terminal 60 may be snapped into the groove to achieve the connection and fixation of the casing 10 and the connection terminal 60. When the connection terminal 60 is screwed to the casing 10, a screw hole (not shown in FIG. 5) may be provided on the casing 10, a screw hole (as shown by 61 in FIG. 5) may also be provided on the connection terminal 60, and the two screw holes are aligned and then are connected and fixed by a bolt or a screw.

Certainly, the electrical connection between the second wire and the casing is not limited to engagement connection and screw connection, and other connection methods, such as but not limited to welding the connection terminal onto the casing, may also be adopted as long as the second wire may be electrically connected to the casing, which is not particularly limited herein.

It is noted that, the three ports included in the end portion 1 shown in FIG. 4 correspond to the conductive terminal 31 and two other terminals 34 in the second insert shown in FIG. 3 (herein, the structure shown in FIG. 3 may also be understood as the abovementioned end portion 2) one-to-one, so as to facilitate effective transmission of signals and avoid confusion during signal transmission.

Certainly, the number of the ports arranged in the end portion 1 and the terminals in the end portion 2 is not limited to three, and may also be set to other numbers such as four (not shown), five (not shown), or six (not shown), this number may be set according to actual needs and is not particularly limited herein.

Optionally, in the embodiments of the disclosure, an anti-corrosion layer is provided at connection between the second wire and the casing.

For instance, as shown in FIG. 5, when the connection terminal 60 is electrically connected to the casing 10, an anti-corrosion layer may be provided at the electrical connection between the connection terminal 60 and the casing 10.

That is, an anti-corrosion layer is provided at the connection position of the second wire and the casing, so that corrosion at the connection may be avoided, the effectiveness of the electrical connection between the second wire and the casing may be improved, and the safety and reliability of the battery apparatus may thus be enhanced.

Optionally, in the embodiments of the disclosure, the casing is made of a metal material. Herein, the metal material may include iron. Certainly, the material for making the casing is not limited to iron, and other metals, such as but not limited to aluminum and other metals, may also be used and are not particularly limited herein. In this way, when the casing is made of a metal material, when the second insert (such as but not limited to the abovementioned second wire) contacts the casing, the electrical connection between the second insert and the casing may be achieved.

It should be emphasized that, when the casing is made of iron and when the anti-corrosion layer is provided at the connection between the casing and the second wire, even if the iron is oxidized and corroded, due to the existence of the anti-corrosion layer, the connection between the second wire and the casing may be prevented from being corroded and an effective electrical connection may be achieved. In addition, the electromagnetic shielding layers are electrically connected to the casing through the second insert, so that the electromagnetic shielding layers and the second insert may be electrically connected effectively, and that the effective electrical connection between the electromagnetic shielding layers and the casing may still be achieved. Therefore, on the basis of safety and reliability improvement of the battery apparatus, the manufacturing process of the battery apparatus may be simplified, and the manufacturing costs may be lowered.

Optionally, in the embodiments of the disclosure, the casing is grounded. For instance, when the battery apparatus is provided with a ground terminal, the casing may be electrically connected to the ground terminal. Certainly, the grounding manner is not limited to the above example, as long as the grounding manner may be implemented, it belongs to the protection scope of the embodiments of the disclosure. In this way, the grounding of the electromagnetic shielding layers may be implemented, the function of the electromagnetic shielding layers is achieved, and the safety and reliability of the battery apparatus are improved.

It is noted that, in FIG. 2 to FIG. 5, the specific structure is shown by taking the first inserts as an example of high-voltage inserts. In actual applications, the specific structures of the first inserts are not limited to those shown in FIG. 2 to FIG. 5, as long as the specific structures of the first inserts are provided with the electromagnetic shielding layers disposed on the surfaces belong to the protection scope of the embodiments of the disclosure.

Optionally, in the embodiments of the disclosure, when the battery apparatus is a battery pack, as shown in FIG. 1, the battery apparatus may further include a plurality of battery modules 70, a battery management system 91, and a battery disconnect unit (BDU) 92. Each battery module 70 is electrically connected to the battery management system 91 and the battery disconnect unit 92 together through an entire wire harness 80. Further, the second insert 30 may also be electrically connected to the battery management system 91 and the battery disconnect unit 92 together through the wire harness (herein, the two other terminals 34 shown in FIG. 3 are electrically connected to the battery management system 91 and the battery disconnect unit 92 individually through the wire harness). In this way, through the battery disconnect unit 92 and the battery management system 91, functions such as charging and discharging, thermal runaway, voltage, current, and state of charges may be conveniently managed for the battery module 70 and the second insert 30.

Certainly, in actual applications, the number of battery management system arranged is not limited to one as shown in FIG. 1, and may also be set to two or other numbers. This number may be set according to actual needs, and it is not particularly limited herein.

In addition, optionally, the battery management system may also be integrated with the battery disconnect unit, so that the space required to be occupied may be reduced and the structural space inside the battery apparatus may be optimized. Specific arrangement may be set according to actual needs, and it is not particularly limited herein.

To be specific, when the second insert 30 is connected to the battery management system 90 through the wire harnesses, as shown in FIG. 5, an adapter b may be provided in the wire harness, and, the electrical connection between the second insert 30 and the entire wire harness 80 may be achieved through the adapter b. The specific implementation form of the adapter b may be set according to actual needs, such as but not limited to an inserting method or an engagement method, which is not particularly limited herein.

To be specific, the number of battery modules in the battery apparatus is not limited to six (as shown in FIG. 1). Here, only six are taken as an example for description, and in actual applications, the number of battery modules may be arranged according to actual needs and is not particularly limited herein.

To be specific, in addition to the above structures, other structures for implementing the functions of the battery apparatus may also be included in the battery apparatus, which are not limited herein.

Certainly, optionally, the battery apparatus is not limited to a battery pack, and may also be other structures including the first inserts, the second insert, and the casing, which is not limited herein.

Other embodiments of the disclosure will be apparent to those skilled in the art from consideration of the specification and practice of the disclosure disclosed herein. The disclosure is intended to cover any variations, uses or adaptations of the disclosure. These variations, uses, or adaptations follow the general principles of the disclosure and include common general knowledge or conventional technical means in the art that are not disclosed in the present disclosure. The specification and embodiments are illustrative, and the real scope and spirit of the present disclosure is defined by the appended claims.

It should be understood that the disclosure is not limited to the precise structures that have been described above and shown in the drawings, and various modifications and variations can be made without departing from the scope thereof. The scope of the disclosure is limited only by the appended claims.

What is claimed is:

1. A battery apparatus, comprising a casing and a first insert disposed on the casing, wherein the first insert has an electromagnetic shielding layer;

the battery apparatus further comprising a second insert disposed on the casing, wherein the first insert and the second insert are arranged at interval;

wherein the electromagnetic shielding layer is electrically connected to the casing through the second insert, the first insert has a body having a cylindrical shape, and the electromagnetic shielding layer is attached on an outer surface of the body, the first insert is a high-voltage insert, and the second insert is a high-voltage interlocking insert, the second insert has a conductive terminal, the electromagnetic shielding layer is electrically connected to the conductive terminal through a first conductive member, the second insert comprises a protective cover, the protective cover is a cavity with an opening and is fixed onto the casing, the conductive terminal is located in the protective cover, and the protective cover has a notch arranged on a side of the protective cover perpendicular to a surface of the casing, so that the first conductive member passes through the notch and enter into the protective cover, the first conductive member is prevented from entering into the protective cover in a direction perpendicular to the surface of the casing, and the first conductive member is prevented from being bent, the first conductive member is electrically connected to the conductive terminal through the notch.

2. The battery apparatus according to claim 1, wherein the second insert is electrically connected to the casing through a second conductive member.

3. The battery apparatus according to claim 2, wherein the second conductive member is engaged with or screwed to the casing.

4. The battery apparatus according to claim 2, wherein an anti-corrosion layer is provided at a connection between the second conductive member and the casing.

5. The battery apparatus according to claim 1, wherein the casing is made of a metal material.

6. The battery apparatus according to claim 1, wherein the casing is grounded.

7. The battery apparatus according to claim 2, wherein the casing is grounded.

8. The battery apparatus according to claim 3, wherein the casing is grounded.

9. The battery apparatus according to claim 4, wherein the casing is grounded.

10. The battery apparatus according to claim 5, wherein the casing is grounded.

* * * * *